(12) United States Patent
Schier

(10) Patent No.: US 8,871,362 B2
(45) Date of Patent: Oct. 28, 2014

(54) TOOL WITH MULTI-LAYERED METAL OXIDE COATING

(75) Inventor: Veit Schier, Leinfelden-Echterdingen (DE)

(73) Assignee: Walter AG, Tübingen (DE)

( * ) Notice: Subject to any disclaimer, the term of this patent is extended or adjusted under 35 U.S.C. 154(b) by 699 days.

(21) Appl. No.: 12/665,246

(22) PCT Filed: May 16, 2008

(86) PCT No.: PCT/EP2008/056037
§ 371 (c)(1),
(2), (4) Date: Mar. 22, 2010

(87) PCT Pub. No.: WO2009/003755
PCT Pub. Date: Jan. 8, 2009

(65) Prior Publication Data
US 2010/0189978 A1    Jul. 29, 2010

(30) Foreign Application Priority Data

Jul. 2, 2007  (DE) .................. 10 2007 030 735

(51) Int. Cl.
| | |
|---|---|
| *B32B 9/00* | (2006.01) |
| *C23C 28/04* | (2006.01) |
| *C23C 14/08* | (2006.01) |
| *C23C 30/00* | (2006.01) |
| *C23C 4/12* | (2006.01) |
| *C23C 14/22* | (2006.01) |

(52) U.S. Cl.
CPC ............ *C23C 14/22* (2013.01); *C23C 28/042* (2013.01); *C23C 28/044* (2013.01); *C23C 14/083* (2013.01); *C23C 30/005* (2013.01); *C23C 14/081* (2013.01); *C23C 4/125* (2013.01)
USPC ........... 428/702; 428/701; 428/472; 428/469; 427/529; 427/580; 427/596; 204/192.15

(58) Field of Classification Search
None
See application file for complete search history.

(56) References Cited

U.S. PATENT DOCUMENTS

| | | | | |
|---|---|---|---|---|
| 4,749,629 | A * | 6/1988 | Sarin et al. ................ | 428/698 |
| 5,879,823 | A | 3/1999 | Prizzi et al. | |
| 7,597,951 | B2 * | 10/2009 | Bjormander et al. ........ | 428/216 |
| 8,119,226 | B2 * | 2/2012 | Reineck et al. ............ | 428/216 |
| 8,119,227 | B2 * | 2/2012 | Reineck et al. ............ | 428/216 |
| 2005/0170162 | A1 | 8/2005 | Yamamoto et al. | |
| 2005/0276990 | A1 | 12/2005 | Kohara et al. | |
| 2006/0014041 | A1 * | 1/2006 | Kohara et al. ............. | 428/621 |

FOREIGN PATENT DOCUMENTS

| | | |
|---|---|---|
| DE | 196 51 592 | 12/1996 |
| DE | 199 37 284 | 2/2001 |
| DE | 10 2004 044 2 | 3/2006 |
| EP | 0 668 369 | 2/1995 |
| EP | 2 037 000 | 3/2009 |
| JP | 2005-262355 | 9/2005 |
| JP | 2006-192543 | 7/2006 |
| WO | 2006/029747 | 3/2006 |

OTHER PUBLICATIONS

International Preliminary Report on Patentability mailed Mar. 11, 2010 issued in PCT Application No. PCT/EP2008/056037.
Kohara et al., "Deposition of α-AL$_2$O$_3$ hard coatings by reactive magnetron sputtering", Surface and Coatings Technology, vol. 185, No. 2-3, Jul. 22, 2004, pp. 166-171.

* cited by examiner

*Primary Examiner* — Mark Ruthkosky
*Assistant Examiner* — Daniel J Schleis
(74) *Attorney, Agent, or Firm* — Morgan, Lewis & Bockius LLP

(57) ABSTRACT

The present invention relates to a cutting tool having a base body and a multilayered coating applied thereto, wherein at least two layers of the multilayered coating arranged one on top of the other contain, or consist of, metal oxide of the same metal or of different metals. In order to create cutting tools which are better than those of the prior art, it is proposed according to the invention that the at least two metal oxide layers arranged one on top of the other be produced successively by different PVD-processes, selected from i) reactive magnetron sputtering (RMS), ii) arc vapour deposition (arc-PVD), iii) ion plating, iv) electron beam vapour deposition and v) laser deposition, wherein modifications of the respective processes i) to v) do not constitute different PVD-processes.

19 Claims, No Drawings

TOOL WITH MULTI-LAYERED METAL OXIDE COATING

RELATED APPLICATION DATA

This application is a §371 National Stage Application of PCT International Application No. PCT/EP2008/056037 filed May 16, 2008, and also claims priority under 35 U.S.C. §119 and/or §365 to German Application No. 10 2007 030 735.9, filed Jul. 2, 2007.

The invention relates to a cutting tool having a base body and a multilayered coating applied thereto, wherein at least two layers of the multilayered coating which are arranged one on top of the other contain, or consist of, metal oxide of the same metal or of different metals.

PRIOR ART

Cutting tools consist of a base body which is made, for example, of hard metal, cermet, steel or high-speed steel. In order to increase durability, or, also, to improve the cutting properties, a single-layered or multilayered coating is often applied to the base body. This single-layered or multilayered coating may, for example, comprise hard metal material layers, oxide layers, and the like. Application of the coating is done by CVD-processes (chemical vapour deposition) and/or by PVD-processes (physical vapour deposition). A plurality of layers within a coating can be applied by means of CVD-processes alone, by means of PVD-processes alone, or by a combination of both processes.

There are various variants of PVD-processes, e.g. i) magnetron sputtering, ii) arc vapour deposition (Arc-PVD), iii) ion plating, iv) electron beam vapour deposition and v) laser deposition. Magnetron sputtering and arc vapour deposition are the most frequently used PVD-processes for coating tools. Within each individual PVD-process variant there are, in turn, various modifications, e.g. pulsed or unpulsed magnetron sputtering, or pulsed or unpulsed arc vapour deposition etc.

The target in the PVD-process may be a pure metal, or a combination of two or more metals. If the target comprises several metals, then all those metals are incorporated at the same time into the layer of a coating constructed during the PVD-process. The ratio of the proportions of metals to one another in the constructed layer depends upon the ratio of the proportions of metals in the target, but it also depends on conditions in the PVD-process, since individual metals are released from the target in greater amounts under certain conditions, and/or are deposited on the substrate in greater amounts than other metals.

In order to produce certain metal compounds reactive gases are fed to the reaction chamber during the PVD-process, e.g. nitrogen to produce nitrides, oxygen to produce oxides, carbon-containing compounds to produce carbides, carbonitrides, oxicarbides etc., or mixtures of these gases to produce corresponding mixed compounds.

EP-A-0668369 discloses a PVD-coating process, wherein hard material layers consisting of nitrides or carbonitrides of the metals Ti, Zr, Hf or alloys of TiAl, ZrAl, HfAl, TiZr, TiZrAl, are produced with an imbalanced magnetron, wherein during a specific time interval of the coating process additional coating material is deposited from a cathodic arc discharge vapour deposition process onto the substrates to be coated.

DE-A-102004044240 discloses the application to one or more metal oxide layers onto a cutting tool in a PVD-process, in particular by the use of magnetron sputtering.

DE-A-19937284 describes an electrically conductive multi-layered build-up on a metal substrate, having a first layer consisting of a metal material, in particular chrome, the surface of which is passivated by naturally formed oxide, and having a further layer of gold or gold alloy material which is applied by means of a PVD-process. That second layer is capable of at least partially cancelling the electrically insulating effect of the naturally formed oxide film of the first layer. Coated arrangements of this kind are used, for example, as supporting structures for the screened housing of electronic components.

DE-A19651592 describes a coated cutting tool having a multilayered coating comprising at least one aluminium oxide layer and hard metal material layers. The hard metal material layers are, for example, TiAlN-layers applied by means of PVD-processes. The aluminium oxide layer which is applied directly thereon is also deposited by way of a PVD-process.

Problem

The problem forming the basis of the present task was to provide cutting tools which are better that the prior art.

This problem according to the invention is solved by way of a cutting tool of the kind mentioned in the introduction, which is characterised in that the at least two metal oxide layers, arranged one on top of the other, are produced successively by different PVD processes selected from i) reactive magnetron sputtering, ii) arc vapour deposition (arc-PVD), iii) ion plating, iv) electron beam vapour deposition and v) laser deposition, wherein modifications of the respective processes i) to v) do not constitute different PVD-processes.

In the sense of the present invention, i) magnetron sputtering, ii) arc vapour deposition (Arc-PVD), iii) ion plating, iv) electron beam vapour deposition and v) laser deposition are "different PVD-processes". Within each of these PVD-processes i) to v) there are modifications, and, in the sense of the present invention, the modifications of a PVD-process are not regarded as "different PVD-processes", Modifications of the "magnetron sputtering" PVD-process are, for example, "dual magnetron sputtering", "RF-magnetron sputtering", "bipolar magnetron sputtering", "unipolar magnetron sputtering", "DC-diode-magnetron sputtering", "DC-triode-magnetron sputtering", "pulsed magnetron sputtering", "unpulsed magnetron sputtering" and mixes of the afore-mentioned processes.

Similarly, various modifications and mixed forms of modifications exist for the "arc vapour deposition" (Arc-PVD), "ion plating", "electron beam vapour deposition" and "laser deposition" PVD-processes. The modifications to PVD-processes i) to v) are very well known to the person skilled in this domain, and therefore do not need to be dealt with in greater detail here.

The application of a multilayered coating, and also of a coating comprising a plurality of metal oxide layers, onto a cutting tool in the form of a wear protection coating has been known for a long time. However, the application of the metal oxide layers to the same base body using different PVD-processes is new and results in completely new coatings with new properties. This new kind of coating according to the present invention opens up a wide range of possibilities for improving and/or adapting the resistance to wear, the durability and/or the cutting properties of cutting tools.

The resistance to wear, the durability and the cutting properties of a coating on a cutting tool are dependent upon various factors, e.g. on the material of the base body of the cutting tool, on the sequence, type and composition of the layers present in the coating, on the thickness of the various layers, and, last but not least, on the type of cutting operation which is performed by the cutting tool. Different resistances to wear can result for one and the same cutting tool, depending upon the type of work piece to be machined, the respective machining process, and other conditions during machining, e.g. the development of high temperatures, or the use of corrosive cooling agents. Furthermore, a distinction is made between different kinds of wear which can have varying degrees of influence upon the useful life, i.e. the durability, of a tool, depending upon the machining operation which it performs. Therefore, the development and improvement of cutting tools must always be considered in terms of which tool properties are to be improved, and it should be assessed under comparable conditions to the prior art.

Surprisingly, it has been seen that by combining various PVD-processes for the purpose of applying at least two metal oxide layers arranged one on top of the other to the base body the properties of the entire coating can be purposefully influenced, and cutting tools with an improved resistance to wear, an improved cutting ability and better durability can be produced.

By applying the metal oxide layers using different PVD-processes, metal oxide layers with different internal stress behaviours (internal compressive stress and internal tensile stress), for example, are produced in relatively large layer thicknesses (e.g. above 5 to 10 µm or more). By slightly adjusting various lattice parameters (e.g. in $Al_2O_3$ and $(AlCr)_2O_3$), whilst the lattice structure is the same, a significant tensioning of the lattice, and thus an increase in hardness, can be produced, for example. Further properties, such as red hardness, thermodynamic stability, low crack propagation and the heat expansion coefficient can be purposefully influenced in a coating according to the invention.

In one embodiment of the invention, in the coating of the cutting tool the two metal oxide layers arranged one on top of the other are arranged directly on one another without an intermediate layer/layers. In dependence on the deposited layers, particularly good adhesion between the layers can advantageously result in this instance.

In an alternative embodiment of the invention, in the coating of the cutting tool there is arranged, between the two metal oxide layers arranged one on top of the other, at least one non-oxide intermediate layer, preferably at least one metal nitride layer.

By way of example, a ZrN-layer can be provided between two $ZrO_2$-layers. By depositing a metal nitride layer as an intermediate layer, the deposition process of the metal oxide layers is stabilised, and "decontamination" of the target(s) can be achieved. Depending upon the material, an improvement in respect of the bonding of the oxide layers has been observed. Furthermore, depending on the material, an increase in hardness has also been found.

According to a further embodiment of the invention, in the coating of the cutting tool one of the at least two metal oxide layers arranged one on top of the other is produced by magnetron sputtering, and another of the at least two metal oxide layers arranged one on top of the other, which is arranged thereabove or therebelow, is produced by arc vapour deposition (arc-PVD).

In another embodiment of the invention, in the coating of the cutting tool the at least two metal oxide layers arranged one on top of the other are produced successively by different PVD-processes in the same PVD-apparatus, without the cutting tool body being removed from the PVD-apparatus between application of the at least two metal oxide layers arranged one on top of the other, and/or without the vacuum which prevails in the PVD-apparatus during the PVD process being reduced between application of the at least two metal oxide layers arranged one on top of the other.

In another embodiment of the invention, in the coating of the cutting tool the at least two metal oxide layers arranged one on top of the other comprise oxides of the elements from Groups IVa to VIIa of the periodic system and/or aluminium and/or silicon.

In another embodiment of the invention, in the coating of the cutting tool at least one of the at least two metal oxide layers arranged one on top of the other has metal oxide of just one metal.

In another embodiment of the invention, in the coating of the cutting tool at least one of the at least two metal oxide layers arranged one on top of the other further has at least one secondary component from carbides, nitrides, oxides, carbonitrides, oxinitrides, oxicarbides, oxicarbonitrides, borides, boronitrides, borocarbides, borocarbonitrides, borooxinitrides, borooxocarbides, borooxocarbonitrides, oxoboronitrides of the elements of Groups IVa to VIIa of the periodic system and/or of aluminium and/or silicon, mixed metal phases and phase mixes of the afore-mentioned compounds.

In another embodiment of the invention, in the coating of the cutting tool the coating comprises further hard material layers consisting of carbides, nitrides, oxides, carbonitrides, oxinitrides, oxicarbides, oxicarbonitrides, borides, boronitrides, borocarbides, borocarbonitrides, borooxinitrides, borooxocarbides, borooxocarbonitrides, oxoboronitrides of the elements from groups IVa to VIIa of the periodic system and/or aluminium and/or silicon, mixed metal phases and phase mixes of the afore-mentioned compounds.

In another embodiment of the invention, in the coating of the cutting tool the layers of the coating have layer thicknesses of 10 nm to 50 µm, preferably of 20 nm to 20 µm, particularly preferably of 0.2 µm to 4 µm.

In another embodiment of the invention, in the coating of the cutting tool the coating has a Vickers hardness (Hv) of between 500 and 4000, preferably of between 700 and 3500, particularly preferably of between 1500 and 3000.

In another embodiment of the invention, in the coating of the cutting tool the base body is produced from hard metal, cermet, steel or high-speed steel (HSS).

In another embodiment of the invention, in the coating of the cutting tool the metal oxides of the at least two metal oxide layers arranged one on top of the other have the same crystal structure. This means that depending on the material deposited improved adhesion of the layers to one another can be achieved. Examples of metal oxides with the same crystal structure are $\alpha$-$Al_2O_3$/$Cr_2O_3$.

In an alternative embodiment of the invention, in the coating of the cutting tool, the metal oxides of the at least two metal oxide layers arranged one on top of the other have a different crystal structure. Depending upon the material deposited, this can be particularly advantageous for inhibiting column growth of the crystals and for avoiding columns of crystallites, which would lead to increased brittleness.

In another embodiment of the invention, in the coating of the cutting tool the phases within the XRD, XPS and/or TEM spectrum which have the highest intensity (the main phases) of the at least two metal oxide layers arranged one on top of the other have the same crystal structure.

In the context of the present invention, the main phases are those phases in a layer of the coating which are clearly in excess over other phases of the same layer.

In another embodiment of the invention, in the coating of the cutting tool the phases in the XRD, XPS and/or TEM-spectrum which have the highest intensity (the main phases)

of the at least two metal oxide layers arranged directly one on top of the other have a different crystal structure.

The invention also comprises a process for the production of a cutting tool with a base body and a multilayered coating applied thereto, wherein metal oxide of the same metal or of different metals is applied successively by different PVD processes in at least two layers of the multilayered coating arranged one on top of the other, wherein the PVD-processes are selected from i) reactive magnetron sputtering, ii) arc vapour deposition (arc-PVD), iii) ion plating, iv) electron beam vapour deposition and v) laser deposition, and wherein modifications of the respective processes i) to v) do not constitute different PVD-processes.

In another embodiment of the process according to the invention, one of the at least two metal oxide layers arranged one on top of the other is applied by reactive magnetron sputtering, and a further one of the at least two metal oxide layers arranged one on top of the other, arranged thereon or thereunder, is applied by arc vapour deposition (arc-PVD).

In another embodiment of the process according to the invention, the at least two metal oxide layers arranged one on top of the other are applied successively by different PVD-processes in the same PVD-apparatus, without the cutting tool body being removed from the PVD-apparatus between the application of the at least two metal oxide layers arranged one on top of the other, and/or without the vacuum which prevails in the PVD-apparatus during the PVD-process being reduced between application of the at least two metal oxide layers arranged one on top of the other.

It will be clear that all individual features, such as described herein for specific embodiments of the invention, can be combined with all the other features of the inventive embodiments described, so far as this is technically reasonable and possible, and that such combinations are considered to be disclosed within the scope of this description. Simply for the sake of better readability, we will not name each and every possible combination here.

Further advantages, features and embodiments of the present invention will be described with the aid of the following examples.

EXAMPLES

In a PVD-coating apparatus (Flexicoat; Hauzer Techno Coating), hard metal substrates composed of HM-coarse grain+10.5% wt Co (HM-coarse grain=WC-hard metal with an average grain size of 3-5 µm) were provided with a multilayered PVD-coating. The substrate geometry was SEHW120408 or ADMT160608-F56 (according to DIN-ISO 1832). Before the layers were deposited, the apparatus was evacuated to $1 \times 10^{-5}$ mbar, and the hard metal surface was cleaned by ion etching with a bias voltage of 170 V.

Depositing of the Layers:

TiAlN (Arc Vapour Deposition; AVD)
  Target: Ti/Al (33/67 At.-%) Round source (63 mm diameter),
  80 amps, 495° C., 3 Pa $N_2$-pressure, 40 volt substrate bias voltage, γ-$Al_2O_3$ (Arc Vapour Deposition: AVD)
  Target: Al-Round source (63 mm diameter),
  80 amps, 495° C., 0.7 Pa $O_2$-pressure, 70 volt substrate bias voltage, γ-$Al_2O_3$ (reactive magnetron sputtering; RMS)
  Target: Al
  10 kW sputtering output, 495° C., 0.5 Pa Ar-pressure, 150 volt substrate bias voltage (unipolar, pulsed)

$ZrO_2$ (Arc Vapour Deposition: AVD)
  Target: Zr-Round source (63 mm diameter),
  80 amps, 495° C., 0.7 Pa $O_2$-pressure, 70 volt substrate bias voltage $ZrO_2$ (reactive magnetron sputtering: RMS)
  Target: Zr
  10 kW sputtering output, 495° C., 0.5 Pa Ar-pressure, 150 volt substrate bias voltage (unipolar, pulsed), The following coatings were applied onto the base body using different PVD-processes:

Example 1

Invention

| Composition | Thickness of Layer | PVD-Process |
| --- | --- | --- |
| TiAlN | 3.0 µm | AVD |
| γ-$Al_2O_3$ | 0.2 µm | RMS |
| $ZrO_2$ | 0.2 µm | AVD |
| γ-$Al_2O_3$ | 0.2 µm | RMS |
| $ZrO_2$ | 0.2 µm | AVD |
| γ-$Al_2O_3$ | 0.2 µm | RMS |
| $ZrO_2$ | 0.2 µm | AVD |
| γ-$Al_2O_3$ | 0.2 µm | RMS |
| $ZrO_2$ | 0.2 µm | AVD |

Comparative Example 1a

| Composition | Thickness of Layer | PVD-Process |
| --- | --- | --- |
| TiAlN | 3.0 µm | AVD |
| γ-$Al_2O_3$ | 0.2 µm | RMS |
| $ZrO_2$ | 0.2 µm | RMS |
| γ-$Al_2O_3$ | 0.2 µm | RMS |
| $ZrO_2$ | 0.2 µm | RMS |
| γ-$Al_2O_3$ | 0.2 µm | RMS |
| $ZrO_2$ | 0.2 µm | RMS |
| γ-$Al_2O_3$ | 0.2 µm | RMS |
| $ZrO_2$ | 0.2 µm | RMS |

Comparative Example 1b

| Composition | Thickness of Layer | PVD-Process |
| --- | --- | --- |
| TiAlN | 3.0 µm | AVD |
| γ-$Al_2O_3$ | 0.25 µm | AVD |
| $ZrO_2$ | 0.25 µm | AVD |
| γ-$Al_2O_3$ | 0.25 µm | AVD |
| $ZrO_2$ | 0.25 µm | AVD |

The tools from Example 1 and from Comparative Examples 1a and 1b were compared in a milling experiment on a workpiece composed of 42CrMoV4-steel (strength: 850 MPa). Milling took place at a constant velocity, without cooling lubricant, at a cutting rate of $v_c$=236 m/min and with a forward feed rate per tooth of $f_z$=0.2 mm.

Wear was measured on the tool flank as an average wear of the cutting edge WCE in mm (of the main cutting edge) after a milling path of 4800 mm. The following values for wear to the cutting edge WCE were found:

|  | Wear to Cutting Edge WCE |
|---|---|
| Example 1: | 0.08 mm |
| Comparative Example 1a: | 0.12 mm |
| Comparative Example 1b: | 0.18 mm |

Comparative Examples 1a and 1b showed an approximately linear increase in wear. The results show a significantly better wear behaviour for the tool according to the invention in Example 1 than for the tools according to Comparative Examples 1a and 1b.

Example 2

Invention

| Composition | Thickness of Layer | PVD-Process |
|---|---|---|
| TiAlN | 3.0 μm | AVD |
| γ-Al$_2$O$_3$ | 0.5 μm | RMS |
| ZrO$_2$ | 0.2 μm | AVD |
| γ-Al$_2$O$_3$ | 0.2 μm | RMS |
| ZrO$_2$ | 0.2 μm | AVD |
| γ-Al$_2$O$_3$ | 0.2 μm | RMS |

Comparative Example 2

| Composition | Thickness of Layer | PVD-Process |
|---|---|---|
| TiAlN | 3.0 μm | AVD |
| γ-Al$_2$O$_3$ | 1.0 μm | RMS |

The tools of Example 2 and of Comparative Example 2 were compared in the same milling experiment as that described for the tools of Example 1 and of Comparative Examples 1a and 1b. The following values for wear to the cutting edge WCE were found:

|  | Wear to Cutting Edge WCE |
|---|---|
| Example 2: | 0.08 mm |
| Comparative Example 2: | 0.11 mm |

The results show a significantly better wear behaviour for the tool of Example 2 according to the invention than for the tool according to Comparative Example 2.

The invention claimed is:

1. A cutting tool having a base body and a multilayered coating applied thereto, wherein at least two layers, arranged one on top of the other, of the multilayered coating contain metal oxide of the same metal or of different metals, wherein the at least two metal oxide layers arranged one on top of the other are produced successively by different PVD processes selected from i) RMS, ii) arc vapour deposition, iii) ion plating, iv) electron beam vapour deposition and v) laser deposition, wherein modifications of the respective processes i) to v) do not constitute different PVD-processes, wherein the at least two metal oxide layers arranged one on top of the other are arranged directly on one another without intermediate layers, wherein the at least two metal oxide layers arranged one on top of the other alternatingly comprise gamma aluminum oxide and zirconium oxide, and wherein the metal oxides of the at least two metal oxide layers arranged one on top of the other have a different crystal structure.

2. A cutting tool according to claim 1, wherein one of the at least two metal oxide layers arranged one on top of the other is produced by RMS, and another of the at least two metal oxide layers arranged one on top of the other, which is arranged thereabove or therebelow, is produced by arc vapour deposition.

3. A cutting tool according to claim 1, wherein the at least two metal oxide layers arranged one on top of the other are produced successively by different PVD-processes in the same PVD-apparatus, without the cutting tool body being removed from the PVD-apparatus between application of the at least two metal oxide layers arranged one on top of the other, and/or without the vacuum which prevails in the PVD-apparatus during the PVD process being reduced between application of the at least two metal oxide layers arranged one on top of the other.

4. A cutting tool according to claim 1, wherein at least one of the at least two metal oxide layers arranged one on top of the other has metal oxide of just one metal.

5. A cutting tool according to claim 1, wherein at least one of the at least two metal oxide layers arranged one on top of the other further has at least one secondary component from carbides, nitrides, oxides, carbonitrides, oxinitrides, oxicarbides, oxicarbonitrides, borides, boronitrides, borocarbides, borocarbonitrides, borooxinitrides, borooxocarbides, borooxocarbonitrides, oxoboronitrides of elements selected from at least one of Groups IVa to VIIa of the periodic system, aluminium, silicon, mixed metal phases, and phase mixes of the afore-mentioned compounds.

6. A cutting tool according to claim 1, wherein the coating comprises further hard material layers consisting of carbides, nitrides, oxides, carbonitrides, oxinitrides, oxicarbides, oxicarbonitrides, borides, boronitrides, borocarbides, borocarbonitrides, borooxinitrides, borooxocarbides, borooxocarbonitrides, oxoboronitrides of elements selected from at least one of groups IVa to VIIa of the periodic system, aluminium, silicon, mixed metal phases, and phase mixes of the afore-mentioned compounds.

7. A cutting tool according to claim 1, wherein the layers of the coating have layer thicknesses of 10 nm to 50 μm.

8. A cutting tool according to claim 1, wherein the coating has a Vickers hardness (Hv) of between 500 and 4000.

9. A cutting tool according to claim 1, wherein the base body is produced from hard metal, cermet, steel or high-speed steel (HSS).

10. A cutting tool according to claim 1, wherein within the XRD, XPS and/or TEM-spectrum the phases which have highest intensity of the at least two metal oxide layers arranged directly one on top of the other have a different crystal structure.

11. A cutting tool having a base body and a multilayered coating applied thereto, wherein at least two layers, arranged one on top of the other, of the multilayered coating contain metal oxide of the same metal or of different metals, wherein the at least two metal oxide layers arranged one on top of the other are produced successively by different PVD processes selected from i) RMS, ii) arc vapour deposition, iii) ion plating, iv) electron beam vapour deposition and v) laser deposition, wherein modifications of the respective processes i) to v) do not constitute different PVD-processes, wherein arranged between the at least two metal oxide layers arranged one on top of the other is at least one non-oxide intermediate layer, wherein the at least two metal oxide layers arranged one on top of the other alternatingly comprise gamma aluminum oxide and zirconium oxide, and wherein the metal oxides of the at least two metal oxide layers arranged one on top of the other have a different crystal structure.

12. A process for the production of a cutting tool with a base body and a multilayered coating applied thereto, wherein metal oxide of the same metal or of different metals is applied successively by different PVD processes in at least two layers of the multilayered coating arranged one on top of the other, wherein the PVD processes are selected from i) RMS, ii) arc vapour deposition, iii) ion plating, iv) electron beam vapour deposition and v) laser deposition, wherein modifications of the respective processes i) to v) do not constitute different PVD-processes, wherein one of the at least two metal oxide layers arranged one on top of the other is applied by RMS, and further one of the at least two metal oxide layers arranged one on top of the other, arranged thereon or thereunder, is applied by arc vapour deposition (arc-PVD), and wherein the at least two metal oxide layers arranged one on top of the other alternatinqly comprise gamma aluminum oxide and zirconium oxide and have a different crystal structure.

13. A process according to claim 12, wherein the at least two metal oxide layers arranged one on top of the other are applied successively by different PVD-processes in the same PVD-apparatus, without the cutting tool body being removed from the PVD-apparatus between the application of the at least two metal oxide layers arranged one on top of the other, and/or without the vacuum which prevails in the PVD-apparatus during the PVD-process being reduced between application of the at least two metal oxide layers arranged one on top of the other.

14. A cutting tool according to claim 1, wherein the at least two layers, arranged one on top of the other, of the multilayered coating consist of metal oxide of the same metal or of different metals.

15. A cutting tool according to claim 7, wherein the layers of the coating have layer thicknesses of 20 nm to 20 μm.

16. A cutting tool according to claim 15, wherein the layers of the coating have layer thicknesses of 0.2 μm to 4 μm.

17. A cutting tool according to claim 8, wherein the Vickers hardness (Hv) is between 700 and 3500.

18. A cutting tool according to claim 17, wherein the Vickers hardness (Hv) is between 1500 and 3000.

19. A cutting tool according to claim 11, wherein the at least one non-oxide intermediate layer includes at least one metal nitride layer.

* * * * *